(12) United States Patent
Mainguet et al.

(10) Patent No.: US 10,381,387 B2
(45) Date of Patent: Aug. 13, 2019

(54) OPTICAL IMAGING DEVICE

(71) Applicants: COMMISSARIAT A L'ENERGIE ATOMIQUE ET AUX ENERGIES ALTERNATIVES, Paris (FR); IDEMIA IDENTITY & SECURITY FRANCE, Issy les Moulineaux (FR)

(72) Inventors: Jean-Francois Mainguet, Grenoble (FR); Francois Templier, Grenoble (FR)

(73) Assignees: COMMISSARIAT A L'ENERGIE ATOMIQUE ET AUX ENERGIES ALTERNATIVES, Paris (FR); IDEMIA IDENTITY & SECURITY FRANCE, Issy les Moulineaux (FR)

( * ) Notice: Subject to any disclaimer, the term of this patent is extended or adjusted under 35 U.S.C. 154(b) by 0 days.

(21) Appl. No.: 15/922,204

(22) Filed: Mar. 15, 2018

(65) Prior Publication Data

US 2018/0269240 A1 Sep. 20, 2018

(30) Foreign Application Priority Data

Mar. 16, 2017 (FR) ..................................... 17 52160

(51) Int. Cl.
*H01L 27/146* (2006.01)
*G06K 9/00* (2006.01)
(Continued)

(52) U.S. Cl.
CPC ...... *H01L 27/14609* (2013.01); *G06K 9/0004* (2013.01); *G06K 9/00013* (2013.01); *G06K 9/00026* (2013.01); *G06K 9/20* (2013.01);
*G06K 9/2054* (2013.01); *G06K 9/4661* (2013.01); *H01L 27/14643* (2013.01);
(Continued)

(58) Field of Classification Search
CPC ............... G06K 9/4661; G06K 9/0004; G06K 9/00046; G06K 9/00053; G06K 9/00013
See application file for complete search history.

(56) References Cited

U.S. PATENT DOCUMENTS 5,101,099 A * 3/1992 Funada ............. H01L 27/14643
250/208.1
5,627,364 A 5/1997 Codama et al.
(Continued)

OTHER PUBLICATIONS

U.S. Appl. No. 15/900,505, filed Feb. 20, 2018, Jean-Francois Mainguet.
(Continued)

*Primary Examiner* — Grant S Withers
(74) *Attorney, Agent, or Firm* — Oblon, McClelland, Maier & Neustadt, L.L.P.

(57) ABSTRACT

Optical imaging device comprising:
an array of substantially point light sources,
an array of photo-detectors interlaced with the array of light sources,
an optical medium of thickness greater than the pitch of the photo-detectors and forming capture and detection surfaces,
means for successively switching on and off each of a part of the light sources and reading a part of the photo-detectors receiving rays coming from the switched on source and having undergone reflection against the detection surface while forming an angle of incidence estimated as a function of the optical medium and the element to image.

18 Claims, 4 Drawing Sheets

(51) Int. Cl.
*G06K 9/20* (2006.01)
*G06K 9/46* (2006.01)
*H01L 27/32* (2006.01)
*H05B 33/08* (2006.01)

(52) U.S. Cl.
CPC .... *H01L 27/14678* (2013.01); *H01L 27/3234* (2013.01); *H05B 33/0803* (2013.01)

(56) References Cited

U.S. PATENT DOCUMENTS

| | | | |
|---|---|---|---|
| 6,529,108 B2 | 3/2003 | Ito et al. | |
| 2002/0079512 A1 | 6/2002 | Yamazaki et al. | |
| 2007/0291325 A1 | 12/2007 | Toyota et al. | |
| 2010/0155578 A1 | 6/2010 | Matsumoto | |
| 2015/0191309 A1 | 7/2015 | Mainguet et al. | |
| 2015/0331508 A1 | 11/2015 | Nho et al. | |
| 2018/0005007 A1* | 1/2018 | Du | G06K 9/0004 |
| 2018/0019288 A1* | 1/2018 | Yang | G06F 3/0412 |
| 2018/0032781 A1 | 2/2018 | Mainguet et al. | |
| 2018/0032782 A1 | 2/2018 | Mainguet et al. | |
| 2018/0046281 A1* | 2/2018 | Pi | A61B 5/02416 |
| 2018/0300528 A1* | 10/2018 | Fourre | G06K 9/0012 |
| 2018/0357460 A1* | 12/2018 | Smith | G06K 9/4661 |

OTHER PUBLICATIONS

French Preliminary Search Report issued Dec. 5, 2017 in French Application 17 52160 filed Mar. 16, 2017 (with English Translation of Categories of Cited Documents).

* cited by examiner

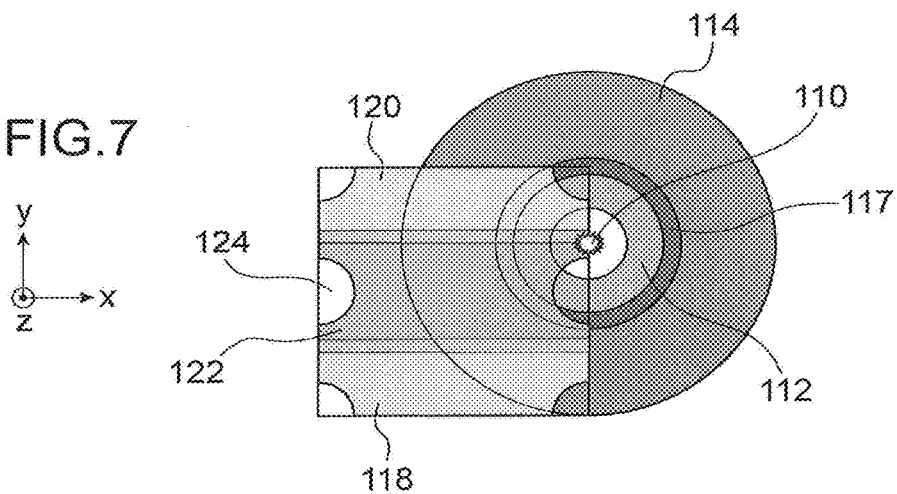
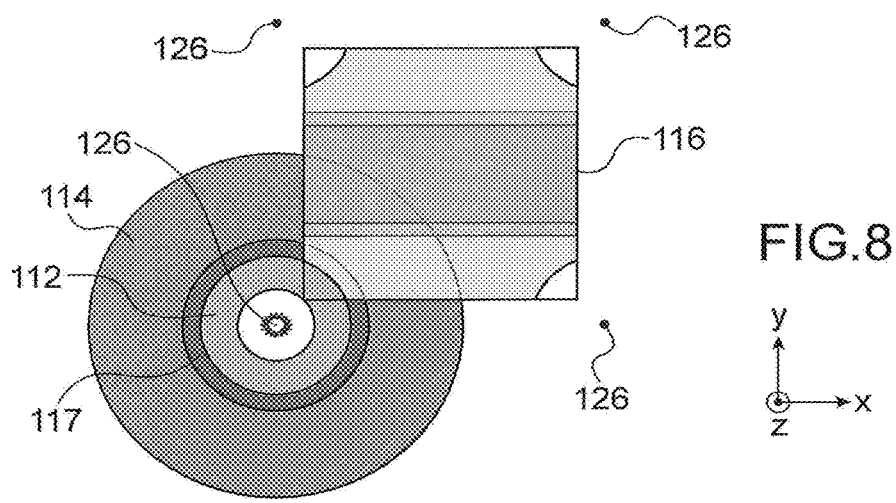
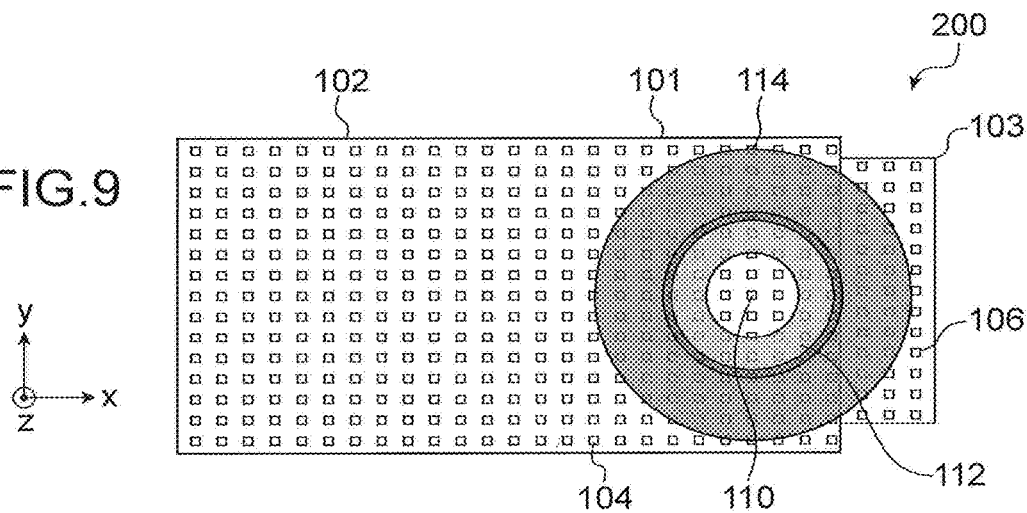

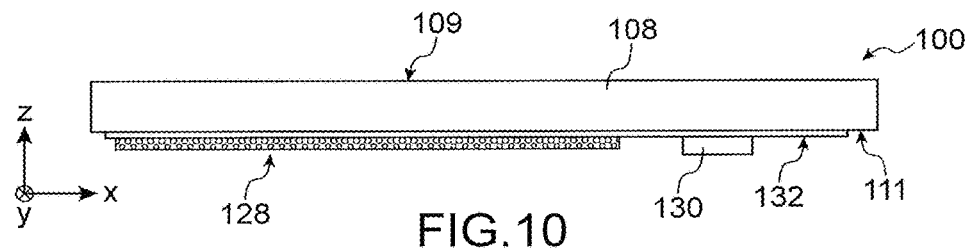
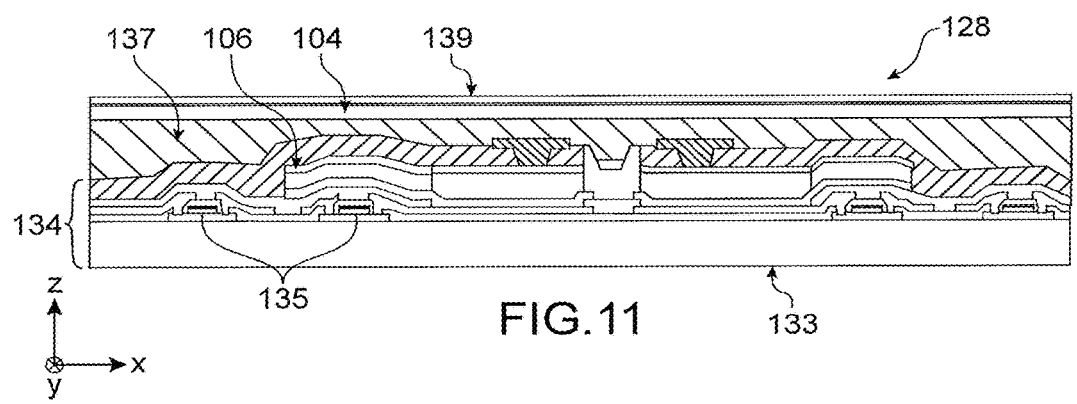
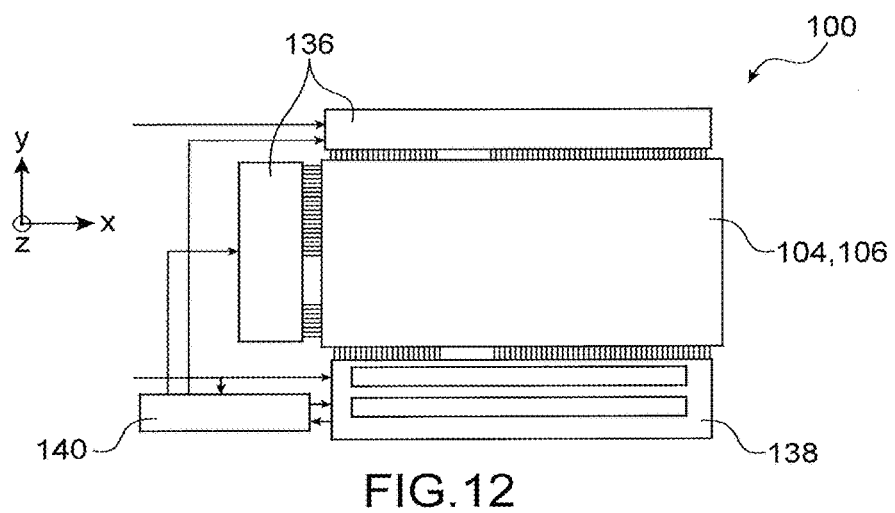

OPTICAL IMAGING DEVICE

TECHNICAL FIELD AND PRIOR ART

The invention relates to the field of optical imaging devices, and notably that of fingerprint sensors, configured for capturing an image optically, that is to say capable of detecting light.

In a fingerprint sensor that captures an image optically, it is known to use a light source of OLED (organic light emitting diode) type produced on a transparent substrate, and a photo-detector such as a diode to read the signal. Given the resolution required for a sensor, generally at least 500 ppi (pixels per inch), it is difficult to integrate, in a same pixel, the photo-detector (for example a PIN diode) and a light source (for example an organic light emitting diode) with their control transistor.

Fingerprint sensors exist in which the capture of a fingerprint image is conducted in a configuration designated "in near field", in which the finger of which the print is imaged has to be located at a short distance (of the order of the sought after resolution, i.e. around 50 µm for a sensor of resolution equal to 500 ppi) from the measuring means of the sensor. The document US 2015/0331508 A1 describes a device which can form such a sensor.

This necessity of having the finger positioned at a very short distance from the measuring means of the sensor is however an important drawback because it is not possible in this case to interpose between the sensor and the finger of which the print is imaged a protective element, for example a glass plate, of sufficient thickness to ensure good protection of the electronics of the sensor.

To avoid this proximity of the finger and the sensor, it is possible to interpose between the sensor and the finger optical means that make it possible to guide light between the finger and the sensor, such as for example optical fibres or lenses as described in the document U.S. Pat. No. 6,259,108 B1. This is however very restrictive, both technologically and economically.

DESCRIPTION OF THE INVENTION

One aim of the present invention is to propose an imaging device configured for implementing an optical detection of an element to image in a configuration that is not in near field, that is to say which is compatible with the presence of a thick protective element between the element to image and the electronic elements of the imaging device (photo-detectors and light sources), which does not require the presence of optical guiding means between the element to image and the photo-detectors of the imaging device.

To do so, the present invention proposes an optical imaging device comprising at least:
  an array of substantially point light sources, produced on a substrate and forming a display screen,
  an array of photo-detectors produced on the substrate and interlaced with the array of light sources,
  an optical medium of thickness greater than the pitch of the photo-detectors of the array of photo-detectors, covering the light sources and the photo-detectors, through which light intended to be emitted by the light sources is capable of propagating, and forming a capture surface against which an element to image is intended to be arranged and a detection surface substantially parallel to the capture surface and against which the arrays of light sources and photo-detectors are arranged,
  control and reading means, or a controller and a reader (or a reading apparatus) configured for successively switching on and off each of a part of the light sources and, during the switching on of each of said part of the light sources, reading at least one part of the photo-detectors intended to receive light rays coming from the lit light source and having undergone at least one reflection against the capture surface while forming, with the capture surface, an angle of incidence of value comprised between, or equal to, that of a first limit angle of refraction defined by the optical index of the optical medium and the optical index of the atmosphere in which the element to image is located, and that of a second limit angle of refraction defined by the optical index of the optical medium and an additional optical index of value greater than that of the optical index of the optical medium and less than or equal to that of the optical index of the element to image.

The pitch of the photo-detectors corresponds to the distance separating the centres of the photosensitive portions of two neighbouring photo-detectors laid out on a same line or a same column of the array of photo-detectors. This pitch is for example equal to around 50 µm. In this case, the optical medium may have a thickness greater than 50 µm.

When the array of photo-detectors is not produced with a constant pitch, for example when the distance separating the centres of the photosensitive portions of two neighbouring photo-detectors laid out on a same line of the array is different from the distance separating the centres of the photosensitive portions of two neighbouring photo-detectors laid out on a same column of the array, or instead the distance separating the centres of the photosensitive portions of two neighbouring photo-detectors laid out on a same line or column of the array is different from one line or from one column to the other, or even instead that this distance varies within a same line or column of the array, the pitch considered to define the minimum thickness of the optical medium is that having the greatest value among the different pitches presents within the array of photo-detectors.

In this imaging device, the light sources emit light rays in a substantially isotropic manner through the optical medium. For the rays forming, with the capture surface, an angle of incidence comprised between the first and second limit refraction angles as defined above, a part of these rays are reflected by the interface between the optical medium and the medium external to the device, that is to say at the level of the capture surface, when the external medium reached by these rays corresponds to the external environment, or the atmosphere (air), in which the element to image is located, and other rays passing through this interface when the external medium reached by these other rays corresponds to the element to image (phenomenon of frustrated total reflection). The reflected light rays comprising the information to detect by the photo-detectors correspond to those delimited by the first and second limit refraction angles.

By successively switching on, one by one, a part of the light sources of the array, partial images of the element to image are obtained which are detected by the photo-detectors located in the region lit up by these reflected rays. A desired final image of the element to image may thus be constructed from these partial images.

This imaging device judiciously uses a thick optical medium which serves both for the propagation of light rays from the light sources up to the photo-detectors (via reflection on the capture surface), and for the protection of the electronic elements (notably the light sources and the photo-detectors) of the imaging device.

Advantageously, the optical medium may correspond to a glass plate of a display screen. At least one part of the light sources of the pixels of this screen may form the light sources of the imaging device (not all of the light sources of the screen are necessarily used to produce the different image acquisitions). With this imaging device, it is not necessary to carry out a thinning of the glass plate at the location of the array of photo-detectors because the imaging device functions perfectly with, as optical medium, a glass corresponding to a standard protective glass of a screen. In addition, the presence of the thick optical medium does not cause loss of precision in the captured image because said optical medium forms part of the imaging device and does not perturb its operation.

Moreover, the resolution of the final image obtained of the element to image is greater than the resolution with which the array of photo-detectors is produced due to the fact that an optical magnification is naturally obtained given the path of the light rays within the optical medium (with reflection against the capture surface), and this is so without having a dedicated magnification optic present in the imaging device. For example, when the light sources and the photo-detectors are arranged in a same plane, for example produced on a same substrate, an optical magnification equal to 2 is obtained (for example, with an array of photo-detectors of resolution equal to 500 ppi, the image obtained with this imaging device is equivalent to an image that would have been captured with an initial resolution equal to 1000 ppi). An image resolution of the order of 2000 ppi or greater than 2000 ppi may also be obtained easily.

The reflection of the light rays against the capture surface corresponds to total reflection. Moreover, the optical paths of the light rays are quite short. Thus, the photo-detectors receive a lot of light, which makes it possible to produce the photo-detectors for example in the form of photodiodes having small dimensions and/or using 1T type reading architectures (each diode is controlled by a single transistor) thanks to the better signal supplied by the photo-detectors. Thus, the photo-detectors require little space for their production, which leaves space for the production of light sources on the same substrate as the photo-detectors.

A light source is substantially a point source when the size of the acquisition zone of a pixel is greater than at least two times, or even at least three times, and preferably greater than ten times, the size of the emitting surface of the light source.

This imaging device is particularly suited to form a fingerprint sensor, the element to image corresponding to skin. Moreover, the atmosphere in which the element to image is located may correspond to air.

Given that the light sources are substantially point sources, the part of the element to image receiving the light rays forming an angle of incidence, with the capture surface, comprised between the first and second limit refraction angles has an annular shape. After reflection against the capture surface, these light rays arrive on the detection surface while lighting up a region of the array of photo-detectors also of annular shape but of greater dimensions than those of the part of the element to image that is lit up.

Such an imaging device proposes an architecture making it possible to obtain images of the element to image of resolution greater than or equal to 500 ppi while being compatible with production using CMOS or OLED technology.

Moreover, the contrast of the images obtained with this imaging device is high and comparable to that obtained with a prism sensor in total reflection, the size of which is much greater than that of this sensor.

The array of light sources is interlaced with that of the photo-detectors, that is to say that the light sources are arranged within the array of photo-detectors, and conversely the photo-detectors are arranged within the array of light sources.

The value of the optical index of the atmosphere in which the element to image is located and that of the additional optical index may be predetermined, that is to say predefined before conducting an image capture.

The control and reading means, or the controller and the reader, may be configured to read, during the lighting of each of said part of the light sources, the photo-detectors located in a region of the detection surface of annular shape delimited by the reflected light rays forming, against the capture surface, the first and second limit refraction angles. For practical reasons, the control and reading means may be configured to control, on the lighting of each of said part of the light sources, the acquisition of said rays by the photo-detectors located in a region of the detection surface of square or rectangular shape including the region of the detection surface of annular shape. Thus, the reading time, or acquisition time, of the photo-detectors located in such a region of square or rectangular shape is reduced and the later digital processing of the square or rectangular images obtained with such an acquisition is then facilitated.

The control and reading means, or the controller and the reader, may be configured such that the photo-detectors read during the lighting of each of the part of the light sources deliver a partial image of the element to image such that each of the partial images obtained partially overlap with at least one other of the partial images of the element to image.

In this case, the imaging device may further comprise means, i.e. a calculator, for computing a final image of the element to image from the partial images of the element to image.

The imaging device may further comprise additional light sources arranged outside of the array of light sources and substantially aligned with the bisecting lines of the angles formed by the corners of the array of light sources. Such additional light sources may notably serve to acquire the corners of the capture surface which cannot be captured using the light sources of the array.

In a first embodiment, the imaging device may advantageously be produced in the form of a CMOS electronic chip, that is to say including transistors produced using CMOS technology on a semiconductor substrate such as silicon. The light sources may in this case correspond to LEDs, advantageously produced from GaN formed beforehand on the semiconductor of the substrate.

In a second embodiment, the imaging device may comprise TFT transistors produced for example on a transparent substrate, for example made of glass, and light sources of OLED type.

Each pixel of the display screen may comprise one of the light sources and one of the photo-detectors. In an alternative, it is however possible that certain pixels formed by the array of photo-detectors and the array of light sources does not comprise a light source (and thus uniquely a photo-detector). It is also possible that certain pixels of the display screen do not comprise photo-detectors.

The light sources may comprise LEDs, and the controller and the reader may comprise CMOS transistors, or the light sources may be of OLED type, and the controller and the reader may comprise TFT transistors arranged in an interlaced manner with the array of photo-detectors. The production of the imaging device with LED technology+CMOS transistors makes it possible to attain very high resolutions. The production of the imaging device with OLED+TFT technology enables, thanks to the optical magnification obtained, the production of pixels of the imaging device with large dimensions at reduced cost, for example produced with a pitch equal to around 100 microns, and/or enhancing the resolution of the image while retaining pixels of reduced dimensions.

Advantageously, when the light sources are of OLED type and when the controller and the reader comprise TFT transistors, said TFT transistors may be produced on the substrate which is transparent and which forms the optical medium.

The thickness of the optical medium may be greater than around 50 µm, or the optical medium may comprise a glass plate of thickness greater than around 100 µm, or greater than or equal to around 200 µm, or greater than or equal to around 400 µm, or greater than or equal to around 700 µm.

The control and reading means, or the controller and the reader, may be configured such that the successively switched on light sources form partial images of the element to image, that is to say having dimensions less than the total dimensions of the final image, each partially overlapping with at least one other of the partial images of the element to image, the final image next being constructed later from these different partial images. In such a configuration, the impact of one or more faulty photo-detectors is thus reduced since the overlap of the partial images makes it possible to obtain, on several of the partial images, redundant information of the element to image.

The invention also relates to a method for capturing images implemented with an imaging device comprising at least:
- an array of substantially point light sources, produced on a substrate and forming a display screen,
- an array of photo-detectors produced on the substrate and interlaced with the array of light sources,
- an optical medium of thickness greater than the pitch of the photo-detectors of the array of photo-detectors, covering the light sources and the photo-detectors, through which light intended to be emitted by the light sources is capable of propagating, and forming a capture surface against which an element to image is intended to be arranged and a detection surface substantially parallel to the capture surface and against which the arrays of light sources and photo-detectors are arranged, the method for capturing images comprising the implementation of the following steps:
a) switching on one of the light sources,
b) reading at least one part of the photo-detectors receiving light rays coming from the lit light source and having undergone reflection against the capture surface while forming, with the capture surface, an angle of incidence of value comprised between, or equal to, that of a first limit angle of refraction defined by the optical index of the optical medium and the optical index of the atmosphere in which the element to image is located, and that of a second limit angle of refraction defined by the optical index of the optical medium and an additional optical index of value greater than that of the optical index of the optical medium and less than or equal to that of the optical index of the element to image,
c) switching off the lit light source,
steps a) to c) being repeated for each of a part of the light sources (104).

The photo-detectors read during step b) may be those located in a region of the detection surface of annular shape delimited by the reflected light rays forming, against the capture surface, the first and second limit refraction angles.

The photo-detectors read during each implementation of step b) may deliver a partial image of the element to image such that each of the partial images obtained partially overlaps with at least one other of the partial images of the element to image.

The method may further comprise the implementation of a step of computing a final image of the element to image from the partial images of the element to image.

Steps a) to c) may also be implemented for additional light sources arranged outside of the array of light sources and aligned with the bisecting lines of the angles formed by the corners of the array of light sources.

BRIEF DESCRIPTION OF THE DRAWINGS

The present invention will be better understood on reading the description off exemplary embodiments given for purely indicative purposes and in no way limiting while referring to the appended drawings in which:

FIG. 9 shows a schematic top view of a part of another imaging device, FIG. 10 shows a schematic sectional view of an imaging device, the subject matter of the present invention, according to a second embodiment, FIG. 11 shows an exemplary embodiment of a stack comprising OLED type light sources and PIN diode type photo-detectors of an imaging device, the subject matter of the present invention, FIG. 12 shows a top view of an exemplary embodiment of an imaging device, the subject matter of the present invention.

Identical, similar or equivalent parts of the different figures described hereafter bear the same numerical references so as to make it easier to go from one figure to the next.

The different parts shown in the figures are not necessarily according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

Figure 1:
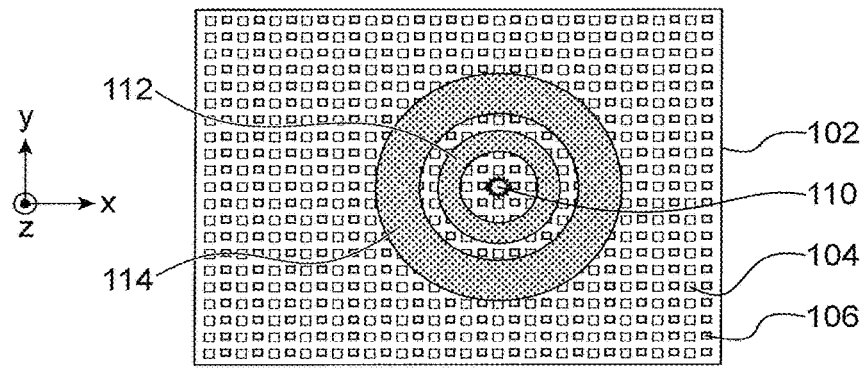
FIG. 1 shows a schematic top view of a part of an imaging device, the subject matter of the present invention, according to a first embodiment.

Reference is firstly made to FIG. 1 which shows a top view of a part of an imaging device 100 according to a first embodiment.

In this first embodiment, the device 100 comprises, on a same semiconductor substrate 102 including for example silicon and gallium nitride (GaN), a plurality of substantially point light sources 104, here corresponding to an array of LEDs, and an array of photo-detectors 106, here photodiodes. The arrays of light sources 104 and photo-detectors 106 are here interlaced, that is to say that the light sources 104 are arranged within the array of photo-detectors 106, and the photo-detectors 106 are also arranged within the array of light sources 104. In this first embodiment, the device 100 comprises several pixels, forming for example an array of 88×88 pixels, each comprising one of the light sources 104 and one of the photo-detectors 106.

The photo-detectors 106 correspond for example to PN or PIN diodes, or to phototransistors produced in the silicon of the substrate 102. The LEDs 104 are advantageously produced from GaN transferred onto the silicon of the substrate 102, this GaN being etched so as to form the substantially point light sources 104. In an alternative, the photo-detectors 106 may be produced on the substrate 102 after the light sources 104.

Moreover, the substrate 102 on which the arrays of LEDs 104 and photodiodes 106 are produced is covered by an optical medium 108 (visible in FIG. 2) which corresponds for example to a glass plate of thickness greater than around 100 μm, for example of the order of 400 μm or 700 μm or instead 1000 μm, and here bonded to the substrate 102.

In an alternative, the optical medium 108 may comprise PMMA (the optical index of which is equal to around 1.49), or any other suitable transparent material.

An adhesive, advantageously having the same optical index as that of the optical medium 108 (or very close thereto), may be present between the optical medium 108 and the substrate 102 which comprises the LEDs 104 and the photodiodes 106. It is also possible that the optical medium 108 is moulded directly on the substrate 102. Generally speaking, the optical medium 108 is optically coupled to the substrate 102 such that there is no air between the optical medium 108 and the photodiodes 106 as well as between the optical medium 108 and the LEDs 104.

The imaging device 100 is intended to be coupled to an electronic device with a display, for example a smartphone or a tablet computer. Thus, the array of LEDs 104 and photodiodes 106 form an additional device intended to be arranged next to the display screen of this device, the optical medium 108 corresponding to the protective glass of this screen.

Although not visible in FIG. 1, the imaging device 100 also comprises control and reading means, or a controller and a reader, configured for controlling the light emission produced by each of the LEDs 104 and controlling the detection of the light information received by the photodiodes 106. These control and reading means comprise electronic components produced for example on the substrate 102.

During an image capture by the imaging device 100, for example during a fingerprint capture of a finger laid on the optical medium 108, several LEDs 104 are successively switched on, a single LED 104 being switched on at one time. In FIG. 1, one of the LEDs 104 is switched on and is designated by the reference 110. This LED 110 lights up the skin located above the optical medium 108, on an upper surface of the optical medium 108 called capture surface 109 (visible in FIG. 2). A region 112 of annular shape and formed around the LED 110 which corresponds to the centre of this region 112, corresponds to the region where the light emitted by the LED 110 undergoes total reflection or not, depending on whether the skin is in contact or not with the capture surface 109. The region 112 is of annular shape because the LED 110 corresponds to a substantially point light source lighting up the optical medium 108 in an isotropic manner.

Before reaching the region 112, the light rays emitted by the LED 110 pass through the optical medium 108 from its rear face, called detection surface 111, and which covers the LEDs 104 and the photodiodes 106, until reaching its front face forming the capture surface 109. After having reached the capture surface 109, a part of these rays (those which do not encounter skin present above the optical medium 108) reflect against this surface and again pass through the optical medium 108 to light up a part of the photodiodes 106 on the detection surface 111. In the example of FIG. 1, the reflected light rays that will form the image intended to be detected by these photodiodes 106 are included, on the detection surface 111, in the region 114 which is also of annular shape and of greater dimensions than those of the region 112.

Figure 2:
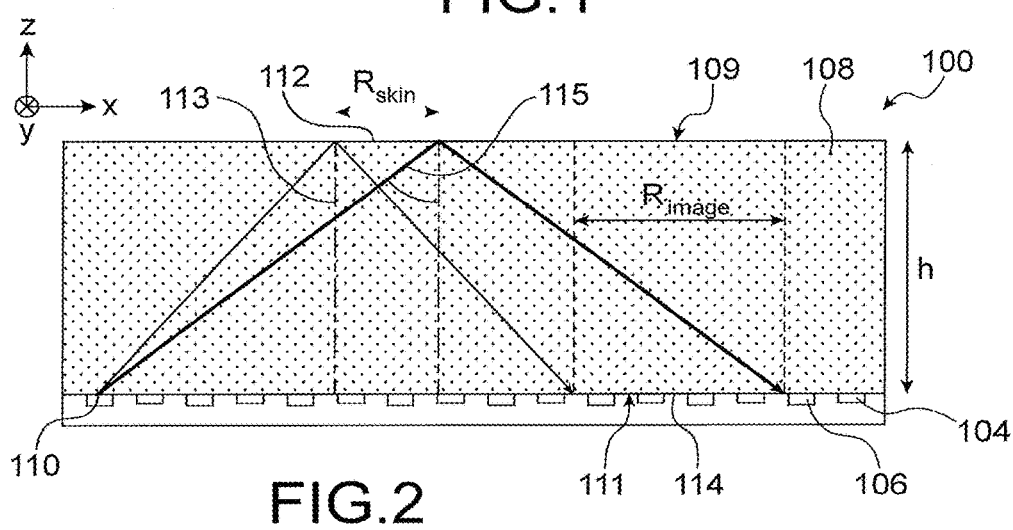
FIG. 2 shows the phenomenon of frustrated total reflection taking place within the imaging device, the subject matter of the present invention.

FIG. 2 schematically shows that which is obtained from an optical viewpoint within the imaging device 100 when the LED 110 is switched on.

The optical characteristics of the frustrated total reflection taking place at the level of the capture surface 109 of the optical medium 108 depend on the optical indices, or refractive indices, of the two media forming the interface considered, that is to say here the optical medium 108 and the external environment.

During operation of the imaging device 100, the value of the optical index of the external environment may be considered as being equal to a fixed value, for example equal to 1.

When the optical medium 108 corresponds to glass, its optical index $n_{108}$ is equal to around 1.51.

Next, given that the imaging device 100 is, in this first embodiment, intended to conduct a fingerprint capture, it is advisable to consider the optical index of the skin, called $n_{skin}$, when skin is in contact with the capture surface 109 (at the level of a ridge of the print), and that of air called $n_{air}$ (at the level of a valley, or hollow, of the print, or next to the skin). Here air (of value equal to 1) is considered but, generally speaking, it is advisable to take into account the index of the atmosphere in which the element to image is located.

The value of the critical angle C, also called limit angle of refraction, which is that corresponding to a refraction of 90° such that $C=\arcsin(n_1/n_2)$, with $n_1 < n_2$ by considering an interface between two optical media of index $n_1$ and $n_2$, will be different depending on whether the light ray passes through the optical medium 108 and arrives on a part of the capture surface 109 in contact with the skin or in contact with air.

The value of $n_{air}$ being equal to 1 and that of $n_{108}$ being equal to 1.51, a first limit angle of refraction obtained between the air and the glass is thus $C_{air/glass}=\arcsin(1/1.51)=41°$.

The value of $n_{skin}$ being comprised between 1.37 and 1.4 and that of $n_{108}$ being equal to 1.51, a second limit angle of refraction obtained between the skin and the glass $C_{skin/glass}$ is thus comprised between the values $\arcsin(1.4/1.51)=68°$ and $\arcsin(1.37/1.51)=65°$. For reasons of simplification, only the value of 65° will be considered hereafter.

Generally speaking, the value of the second limit angle of refraction may be calculated by considering the optical index $n_{108}$ of the optical medium 108, for example equal to 1.51 when the optical medium 108 corresponds to glass, and an additional optical index of value greater than that of the optical index $n_{108}$ of the optical medium 108 and less than or equal to that of the optical index $n_{skin}$ of the element to image.

Thus, returning to FIG. 2, when the light rays emitted by the lit light source 110 form an angle of incidence, with the normal to the capture surface 109, comprised between 0 and 41°, no or very little light reflection takes place at the interface formed at the level of the surface 109. The light rays then come out of the optical medium 108 and no or very little light arrives on the photodiodes 106 by reflection, and this applies whatever the element (air or skin which is an absorbing scattering medium for light) present on the part of the capture surface 109 receiving these rays. The image formed by the photodiodes 106 located in the corresponding reflection zone is thus dark on account of the very small quantity of light arriving in this reflection zone. The light information arriving in this zone and which is not exploited for the reconstruction of the captured image may however serve for other applications, for example when the device is configured for detecting the nature of the imaged element.

When the light rays form an angle of incidence greater than 65°, total reflection takes place, and this occurs whatever the element (air or skin) present on the part of the capture surface 109 receiving these rays. The image formed by the photodiodes 106 located in the corresponding reflection zone is thus bright given that these photodiodes 106 receive the totality or practically the totality of these light rays (the quantity of light decreasing however when the distance between the photo-detectors and the light source increases).

Finally, when these light rays form an angle of incidence between 41° and 65°, if air is present on the capture surface 109, then a phenomenon of total reflection takes place. The rays are reflected at the interface formed by the capture surface 109 to next arrive on the photodiodes 106. The image obtained of air is thus bright. If skin is present on the capture surface 109, the light is diffused in the skin, and no or practically no light is reflected to the photodiodes 106 (the image of the skin given by the photodiodes 106 corresponds to a dark region).

In FIG. 2, the reference 113 designates a light ray forming, with the normal to the capture surface 109, the first limit angle of refraction equal to 41°, and the reference 115 designates a light ray forming, with the normal to the capture surface 109, the second limit angle of refraction equal to 65°. For clarity reasons, the values of the angles shown in FIG. 2 do not quite correspond to these values.

The part of skin imaged when the LED 110 is switched on corresponds to that located on the region 112 of the capture surface 109 of annular shape delimited by the rays 113 and 115. The corresponding image formed on the detection surface 111 corresponds to the region 114 of this surface which is also of annular shape and delimited by the rays 113 and 115 arriving on the detection surface 111 after reflection against the capture surface 109. The system is thus invariant by rotation around the LED 110.

On the image obtained by the light capture conducted by the photodiodes 106 located at least in the region 114, the ridges of the print appear as dark on a light background which represents the air around the print or the hollows of the print.

The size of the image formed on the photodiodes 106, that is to say the dimensions of the region 114, is greater than that of the portion of skin read which corresponds to the region 112. A magnification factor greater than 1, here equal to 2, is thus obtained with the imaging device 100. This magnification of the image is obtained without having to use optical means dedicated to this magnification.

At the interface between the element to image and the optical medium 108, that is to say at the level of the capture surface 109, the distance between the rays 113 and 115, which corresponds to the difference between the external diameter and the internal diameter of the ring formed by the region 112, is equal to:

$R_{skin} = h \cdot (\tan(C_{skin/glass}) \tan(C_{air/glass})) = h \cdot (\tan(65°) - \tan(41°))$.

At the interface between the optical medium 108 and the photodiodes 106, that is to say at the level of the detection surface 111, the distance between the first and second rays 113, 115 after reflection on the capture surface 109, which corresponds to the difference between the external diameter and the internal diameter (that is to say the width) of the ring formed by the region 114, is equal to:

$R_{image} = 2h \cdot (\tan(C_{skin/glass}) - \tan(C_{air/glass})) = 2h \cdot (\tan(65°) - \tan(41°))$.

The magnification obtained is thus equal to $G = R_{image}/R_{skin} = 2$.

This magnification is equal to 2 due to the fact that the rays forming the image on the photo-detectors 106 cover a distance equal to twice that travelled by the light rays between the light source and the finger of which the image is captured.

The table below gives examples of values of dimensions obtained for the regions 112 and 114 of annular shape as a function of the thickness h of the optical medium 108, with the optical indices mentioned previously. The width here corresponds to the difference between the external diameter and the internal diameter of one of the regions 112 and 114.

| Thickness h | 1000 µm | 700 µm | 400 µm |
|---|---|---|---|
| Width region 114 | 2250 µm | 1785 µm | 1020 µm |
| Width region 112 | 1125 µm | 892 µm | 510 µm |
| External diameter region 114 | 8578 µm | 6004 µm | 3431 µm |
| External diameter region 112 | 4289 µm | 3002 µm | 1716 µm |

The size of the image of the element to image obtained on the photo-detectors 106, which corresponds to the detection field obtained when one of the light sources 104 is switched on, is thus two times greater than that of the region of skin 112 corresponding to this image, and is proportional to the thickness h of the optical medium 108.

In the first embodiment of the imaging device 100, the light sources 104 and the photo-detectors 106 are produced on a same substrate 102 and are arranged at a same distance h from the capture surface 109 which corresponds to the thickness of the optical medium 108. This distance h is chosen such that it is greater than the pitch of the array of photo-detectors 106 in order that the imaging device 100 does not function in near field.

Figure 3:
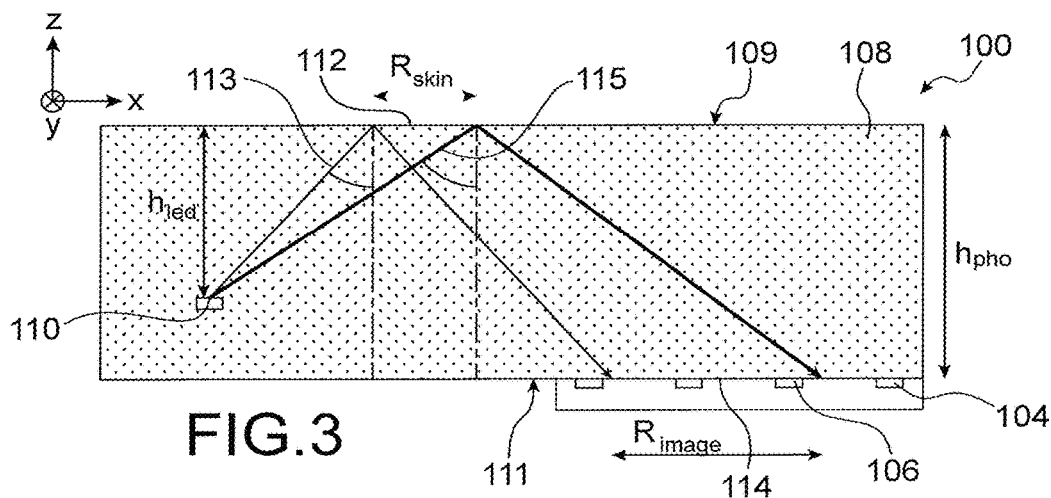
FIG. 3 shows the phenomenon of frustrated total reflection taking place within the imaging device, the subject matter of the present invention, according to an alternative embodiment, FIG. 4 schematically shows detection and capture regions which can be obtained with an imaging device, the subject matter of the present invention, FIGS. 5 to 8 schematically show different capture phases implemented during an image acquisition by the imaging device, the subject matter of the present invention.

It is possible that the light sources 104 and the photo-detectors 106 are not arranged at a same distance from the capture surface 109. FIG. 3 schematically shows such a configuration. The arrays of light sources 104 and photo-detectors 106 may be seen as being interlaced but arranged on different levels.

In this FIG. 3, $h_{pho}$ designates the thickness of material of the optical medium 108 between the photo-detectors 106 and the capture surface 109, and $h_{led}$ designates the thickness of material of the optical medium 108 between the light sources 104 and the capture surface 109. This then gives:

$R_{skin} = h_{led} \tan(C_{skin/glass}) - h_{led} \tan(C_{air/glass}) = h_{led} (\tan(65°) - \tan(41°))$ $$R_{image} = (h_{led} + h_{pho}) \cdot \tan(C_{skin/glass}) - (h_{led} + h_{pho}) \cdot \tan(C_{air/glass})$$

$$R_{image} = (h_{led} + h_{pho}) \cdot (\tan(65°) - \tan(41°)).$$

The magnification obtained in such an imaging device 100 is equal to $G = 1 + h_{pho}/h_{led}$.

This magnification G thus only depends on the geometric parameters of the imaging device 100 and does not depend on the quality of the material of the optical medium 108 or the nature of the element to image. This magnification G is here always greater than 1. Thus, the resolution of the image captured by the photo-detectors 106 is greater than that of the array of photo-detectors 106 itself, and this is so without using dedicated optical magnification means.

The value of the magnification G may be modified for example by modifying the values of $h_{pho}$ and $h_{led}$. Thus, the value of the magnification G may be brought close to the value 1 by increasing for example the value of $h_{led}$. The value of the magnification G may be increased by increasing for example the value $h_{pho}$.

In FIG. 1, which shows a schematic top view of the imaging device 100, the regions 112 and 114 are shown such that they are not superimposed. However, in reality, by considering the values of limit angle of refraction of 41° and 65°, these regions 112 and 114 are partially superimposed, that is to say that the value of the external diameter of the annular region corresponding to the region 112 is less than that of the internal diameter of the annular region corresponding to the region 114.

By successively switching on several light sources 104, several images, each corresponding to a part of the element to image present on the capture surface 109, are captured by the photodiodes 106. The number of light sources 104 to switch on, and thus the number of images to capture, is for example chosen as a function of the dimensions of the capture zone which corresponds for example to a square of which the dimensions may be chosen as a function of needs and/or the design of the acquisition system, for example 5 mm×5 mm or 12.8 mm×12.8 mm. Due to the fact that the optical parameters described previously relative to the light reflections taking place in the device 100 may be determined in advance (values of $R_{skin}$, $R_{image}$, positions of the regions 112 and 114, etc.), it is possible to know, for each light source 104 that will be switched on, the photo-detectors 106 that will form part of the region 114 associated with the lit light source 104. It is thus not necessary that, on lighting each light source 104, all the photo-detectors 106 of the imaging device 100 conduct an acquisition. Only the photo-detectors 106 included in the region 114, or forming for example a square or a rectangle including the region 114, can conduct this acquisition. It is also possible that the photo-detectors 106 conducting the acquisition are those included in a region smaller than the region 114. A greater number of acquisitions must in this case be conducted.

When a greater number of photo-detectors 106 than those belonging to the region 114 conduct the detection of each of the images, a digital processing is carried out after the capture of each image. Thus, the data supplied by the photo-detectors 106 located at the centre of the image, that is to say those surrounded by the region 114 as well as by those located around the region 114 are eliminated. The data coming from the photo-detectors 106 located straddling the region 114 and the internal or external diameter of the region 114 may be also eliminated.

Moreover, in the different images obtained by successively switching on several light sources 104, given that the position of the light source used for the capture of each of the images is offset, in the plane of the substrate 102, for each of the images obtained, it is advisable also to offset, during the reconstruction of the final image of the element imaged from the different images, the pixels of the images common with each other taking into account the magnification G in order that the common parts of the different images are correctly superimposed within the final image. It is for example possible only to conserve the information of each pixel a single time, that is to say that the light information of each pixel of the final image comes from a single captured image. In an alternative, it is possible to compute the average or the median of the different captures of each pixel, or instead to use more complex computing algorithms. Before conducting the computation of the final image, and due to the fact that the intensity of the light decreases when the distance with respect to the LED increases, it is advantageous to conduct a digital processing of the different images making it possible to compensate these differences in light intensity within each of the images. This compensation may be conducted either from a pre-defined model, or by conducting beforehand a blank acquisition with the device 100 (without a finger on the capture surface 109).

The different light sources 104 successively switched on are chosen such that the captured regions 112 together cover the totality of the surface of the element to image. By switching on, on one line of the array of pixels, several light sources 104 (each enabling the acquisition of an image), and doing so for several lines of the array of pixels, it is possible to cover a major part of this surface of the element to capture. However, given the shape of the region 112 which corresponds to a ring, it is advantageous to switch on certain light sources 104 located on the vertical edges of the array of pixels of the imaging device 100 and/or in the corners of this array, in order to lose the least possible detection surface.

In an alternative, it is also possible that during the capture conducted for each lit light source 104, only a part of the photo-detectors 106 located in the region 114, for example groups of photo-detectors 106 together forming rectangles arranged within the region 114, conduct a detection of the light received. According to another alternative, it is for example also possible to read one or more photo-detectors 106 located in the region 114, on switching on each light source 104, the number of image acquisitions being in this case greater.

The imaging device 100 described above in relation with FIG. 1 may comprise photodiodes 106 and LEDs 104 produced using CMOS technology. The LEDs 104 may advantageously be produced from GaN transferred onto the silicon substrate 102 including the photo-detectors 106 produced using CMOS technology (as well as the reading electronics, or even the processing electronics).

The photo-detectors 106 and the light sources 104 form for example pixels (each pixel comprising a photo-detector 106, a light source 104 such as an LED of dimension equal to 10×10 $\mu m^2$ or 3×3 $\mu m^2$, transistors, etc.) of dimension equal to 50×50 $\mu m^2$. In this case, with a magnification G equal to 2, the resolution of the final image obtained is equivalent to 1000 ppi whereas the resolution of the pixels of the imaging device 100 is 500 ppi. Thus, by considering a square including a detection region 114 including 120 pixels×120 pixels (each of dimension 50×50 $\mu m^2$), i.e. 6000×6000 $\mu m^2$ and thus including a ring of 6 mm external diameter corresponding to the useful region for an optical medium 108 corresponding to a glass of thickness equal to 700 µm, the capture region 112 of the imaging device 100 may correspond to a square of dimension equal to 3000× 3000 µm².

With the dimensions of pixels indicated above and with an optical medium 108 corresponding to glass of thickness equal to 700 µm, it is possible to light for example, on a same line of pixels, one LED 104 every 8 pixels (in order to have a capture offset corresponding to half of the width of the ring formed by the region 112), or even every 9 or 10 pixels, in order that the partial images obtained together form the part of the final image corresponding to this line of pixels. With such a reading, only one line of pixels out of 50, or 55 or even 60, is sufficient to obtain all of the partial images enabling the reconstruction of the final image including the totality of the capture surface. Other pitches and other sizes of capture/detection regions are possible, a sufficient overlap of the images enabling the final image to be obtained.

Figure 4:
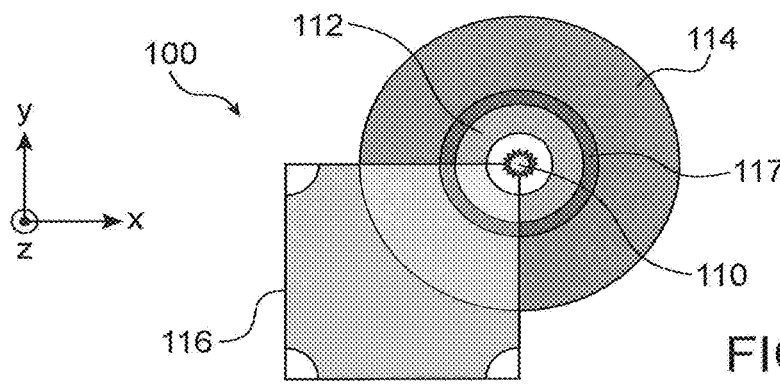

FIG. 4 shows the regions 112 and 114 obtained in the particular configuration described above (magnification G equal to 2, optical medium 108 corresponding to a glass plate of thickness equal to 700 µm). The region of skin located on the capture surface 109 and which is intended to be detected here corresponds to a square of dimensions equal to 4.4×4.4 mm² referenced 116. In FIG. 4, the regions 112 and 114 partially overlap each other at the level of a region referenced 117. Moreover, these regions 112 and 114 shown in FIG. 4 correspond to those obtained with a lit light source 110 positioned in the upper right corner of the region 116 to image. Finally, FIG. 4 illustrates the fact that the corners of the region 116 cannot be detected by the photo-detectors 106 located in the region 116 because even by switching on the light sources located in these corners, the latter are lit by rays forming, with the capture surface 109, an angle of incidence less than the first limit angle of refraction.

In this configuration, it is for example possible to conduct firstly the capture of upper and lower bands of the region 116 by successively switching on the light sources 104 located in the pixels forming the upper and lower edges of the region 116. For each of these bands, one light source 104 every 8 pixels may for example be switched on, i.e. 12 light sources 104 per band.

Figure 5:
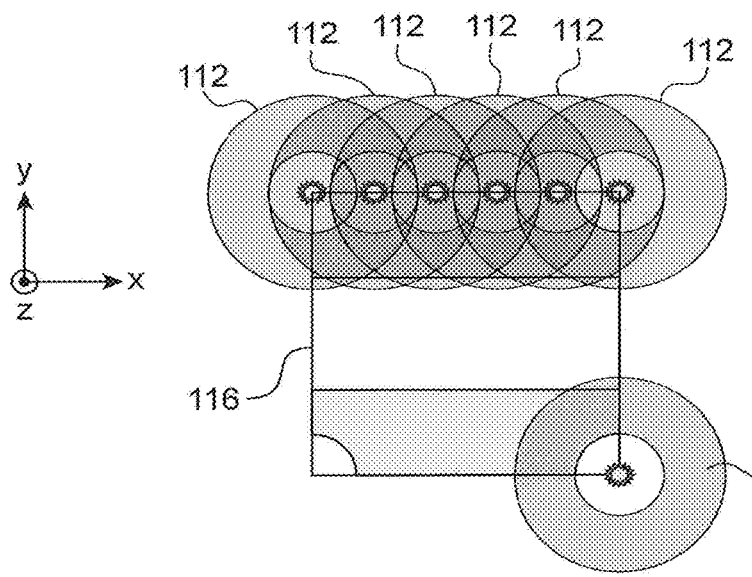

FIG. 5 schematically shows a part of the regions 112 imaged during a capture of these upper and lower bands of the region 116.

Advantageously, the light sources 104 which are switched on are chosen in order that each of the different regions 112 captured has an overlap with one or more other regions 112.

The capture of a central band of the region 116 may be produced by lighting the light sources 104 (for example one every 8 pixels) of a line located substantially at the centre of the region 116.

Figure 6:
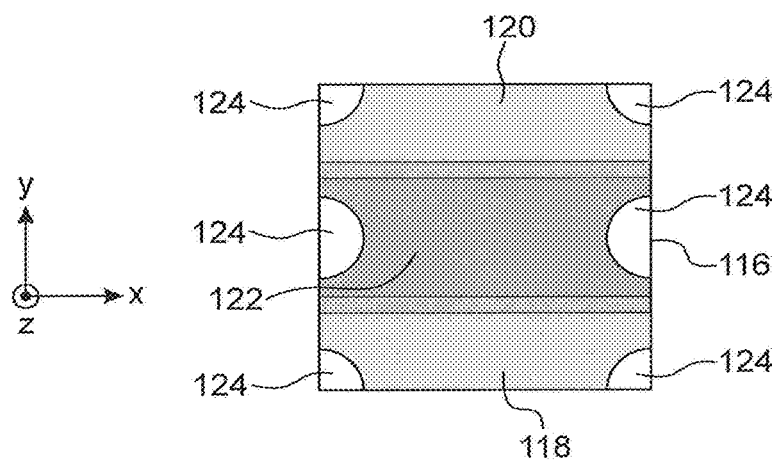

FIG. 6 shows the parts of the region 116 captured at this stage and which correspond to 36 partial images of the print. The references 118, 120 and 122 designate respectively the lower, upper and central bands of the region 116 (with a small overlap between the parts 118 and 122, as well as between the parts 120 and 122). Moreover, the reference 124 designates the corners of the regions 116 as well as the parts of the edges of the central region 122 which are not captured during the reading of the three bands 118, 120 and 122.

The parts 124 of the edges of the central region 122 not captured by the steps implemented previously may be captured by lighting light sources 104, for example four in number, located at the level of the edges of the region 122. FIG. 7 shows the regions 112 and 114 obtained by switching on one of these light sources, referenced 110 in FIG. 7, and which makes it possible to capture partially one of these parts 124 not captured initially during the acquisition of the central band 122. At this stage of the acquisition, 40 partial images of the print have been obtained.

Next, to conduct the reading of the corners of the region 116, it is possible to produce the imaging device 100 such that it comprises, in addition to the array of light sources 104, at least four additional light sources 126 located outside of the array formed by the light sources 104, and each arranged along a bisecting line of the angle of one of the other corners of the region 116. FIG. 8 schematically shows these four LEDs 126 which make it possible to conduct the acquisition of the corners of the region 116. With an imaging device 100 having the dimensions described previously, each of the additional light sources 126 is for example arranged at a distance equal to around 600 µm from the corner the closest to the array. It is also possible that several additional light sources 126 are arranged along each of the bisecting lines of the angles of the corners of the array of light sources 104, at different distances with respect to these corners. Thus, as a function of the thickness of the optical medium 108, it is possible to use, for the acquisition of each corner, the additional light source 126 located at the adequate distance from the array to conduct this acquisition.

In an alternative, notably when the imaging device 100 is of considerable size, it is possible not to read the corners of the region 116.

Other methods of reading the region 116 than that described above are possible. For example, it is possible that on switching on each of the light sources 104, only a part of the region 114 is read by the photo-detectors 106, for example one or more parts of square shape included in the region 114, or even uniquely one or several photo-detectors 106 included in the region 114. The sequence of switching on the light sources 104 is in this case adapted in order to have a certain overlap between the different captured images.

In the examples given above, each of the pixels (which comprise a light source 104 and a photo-detector 106) has a dimension equal to around 50 µm×50 µm². These dimensions may be different: for example each pixel may have dimensions equal to around 25 µm×25 µm, or even equal to 12.5 µm×12.5 µm.

Finally, if information is missing for one or more pixels of the final image, it is possible to implement an interpolation in order to compute said information.

FIG. 12 shows a top view of the imaging device 100, here according to the first embodiment, on which the control and reading means configured for switching on and off successively each of the light sources 104 and, during the lighting of each of the light sources 104, of reading the photo-detectors 106 and controlling the acquisition by the photo-detectors 106 of a partial image of the element to image, are visible. These control means here comprise for example circuits 136 for addressing the light sources 104 and photo-detectors 106. The imaging device 100 also comprises means 138 for processing information captured by the photo-detectors 106. These means 138 are for example those constructing the different partial images obtained then computing the final image of the captured print, from the different partial images. Finally, the imaging device 100 also comprises a control element 140 connected to the circuits 136 and to the means 138 and controlling these elements.

FIG. 9 shows an imaging device 200 according to another exemplary embodiment.

Unlike the imaging device 200 according to the first embodiment in which the arrays of photo-detectors 106 and light sources 104 are interlaced with each other, the array of photo-detectors 106 of the imaging device 200 is arranged next to the array of light sources 104, in a sensor part 103 of the device 200 distinct from a display part 101 of the device 200. Typically, the display part 101 may correspond to a screen of an electronic device, for example a smartphone, at the edge of which the sensor part 103 is arranged. The sensor part 103 may be juxtaposed or not with the display part 101.

In FIG. 9, the regions 112 and 114 obtained during the lighting of one of the light sources 104, referenced 110 in this figure, are shown. By lighting several light sources 104 of the same column as the light source 110, it is possible to conduct the capture of a region of the element to image located on the display part 101, at the level of the edge juxtaposed with the sensor part 103. An additional capture may also be conducted using the light sources 104 of one or more other columns of the display part 101, this or these columns remaining close to the sensor part 103 so that the region 114 is indeed located at least partially on the sensor part 103.

By using as optical medium 108 a glass plate of thickness equal to around 700 μm, it is possible to obtain a region 114 of width equal to around 1725 μm (which corresponds to 34 pixels each of width equal to 50 μm) when a single column of light sources 104 is used. In this configuration, the distance between the light sources 104 of the column used and the region 114 is equal to 1217 μm.

Moreover, in the device 200, it is advantageous to have a thick optical medium 108, for example obtained by superimposing two (or more) glass slides, enabling for example an optical medium 108 of thickness greater than or equal to 1 mm to be obtained.

In the configuration shown in FIG. 9, the sensor part 103 is arranged next to the display part 101. In an alternative, if the display part 101 is produced such that is forms an at least partially transparent screen, that is to say capable of being traversed by a part of the light received, the sensor part 103 may be arranged under this screen. In this case, the arrays of light sources and photo-detectors may be seen as being interlaced but arranged on different levels.

The device 200 is preferably such that the display part 101 is produced with light sources 104 of OLED type, and advantageously such that the emission of light takes place through the substrate 102 (for example made of glass) on which the light sources 104 are produced (bottom emission or rear emission) and through the optical medium 108. In bottom emission configuration, the transparent conductive tracks, including for example ITO, of the substrate 102 on which the light sources 104 are produced may be used to connect the sensor part 103. The upper metal levels may also be used.

It is also possible to produce the device 200 such that transparent holes are present within the display part 101, the sensor part 103 being able in this case to be transferred onto the display part 101 by arranging the photo-detectors 106 facing the transparent holes.

FIG. 10 shows the imaging device 100 according to a second embodiment. In this second embodiment, the optical medium 108 corresponds to the transparent substrate used for the production of TFT transistors serving for the addressing of the pixels of the device 100, and which form part of the control means of the imaging device 100. In FIG. 10, the reference 128 designates the assembly formed on the side of the detection surface 111 and which comprises the addressing TFT transistors, the light sources 104 of OLED type emitting their light on the side of their rear face, and the photo-detectors 106 which are for example PIN photo-diodes. One or more electronic chips 130 driving for example the lighting of the light sources 104 and/or the reading by the photo-detectors 106 are also arranged on the side of the detection surface 111, next to the assembly 128. Thus, the other face of the substrate forming the optical medium 108 remains free and forms the capture surface 109 on which the element to image, typically a finger, is intended to be located. An interconnection layer 132 is present between the optical medium 108 and these elements 128, 130.

In this second embodiment, the optical medium 108 may have a thickness greater than or equal to around 1 mm, for example comprised between around 1 mm and 2 mm. Such a thick optical medium 108 is for example obtained by bonding several slides of same optical index with an adhesive, or glue, also having this same optical index in order not to have any reflection at the interface formed by the glue.

Moreover, it is possible that the light sources 104 of OLED type produce a light emission from their front face, the light emitted only passing through the optical medium 108 transferred onto these light sources 104 and not the substrate 102.

The device 100 according to this second embodiment may be such that it is of large dimensions and configured for conducting a simultaneous capture of the fingerprints of several fingers or instead of a complete hand. In this case, an optical medium 108 of considerable thickness, for example greater than around 1 mm, makes it possible to ensure the device 100 has a certain solidity.

FIG. 11 shows the technological stack produced to form such an assembly 128. The reference 133 designates the face of this assembly 128 which is intended to be located on the side of the optical medium 108. Firstly, a part 134 comprising addressing TFT transistors 135 is produced from polycrystalline silicon. These TFT transistors 135 may also be produced from amorphous silicon or IGZO. Polycrystalline silicon is preferably used because it makes it possible to obtain better electrical conductance, which makes it possible to reduce the size of the TFT transistors. This part 134 also includes the different lines of electrical interconnections of the imaging device 100.

The stack of layers forming the photo-detectors 106, for example PIN diodes, is next formed on the part 134. Amorphous silicon may advantageously be used to produce these PIN diodes The electrodes of the PIN diodes located on the side of the TFT transistors may be formed by a conductive layer dedicated to these electrodes, or be formed within a metal level common to the transistors. The electrodes of the PIN diodes located on the side of the light sources 104 are produced from an electrically conductive material and are for example opaque.

A planarising insulating material 137 is next deposited on the assembly produced, forming a flat surface on which the light sources 104 of OLED type are next produced. The production of diodes of OLED type notably comprises the implementation of a deposition and a lithography of a conductive material to form the anodes, then the deposition of emissive organic layers, and the production of a cathode common to the diodes. Producing the OLED diodes after the other elements of the imaging device 100 makes it possible not to expose the materials used to form the OLED diodes to the temperatures and solvents used for the production of the preceding elements. The OLED structure produced is transparent, with for example a metal layer forming a mirror arranged on the cathode to reflect light, and the emission of light produced may be monochromatic (any wavelength of the whole visible, UV and IR range), or white thanks to a vertical stack of two or three colours emitted.

An encapsulation material 139 is next deposited on the assembly produced.

TFT transistors may be arranged in the periphery of the array of light sources 104 and photo-detectors 106 to form the means serving for the control and/or for the reading and thereby limit the number of inputs/outputs to produce to the external control circuits produced using silicon technology, for example CMOS technology.

In an imaging device 100 produced with light sources 104 of OLED type and control means including TFT transistors, each light source 104 of OLED type may be controlled by two TFT transistors (a first to select the pixel, and a second to supply the OLED diode) in the case of an active array (AMOLED solution), or instead be controlled by a passive array forming a grid with lines and columns of conducting lines enabling a lighting of the OLED diode when the lighting voltage is applied to the line and the column corresponding to this diode (PMOLED solution). Each photo-detector 106 of PIN diode type may be controlled by another TFT transistor (in the case of a so-called passive reading), or by several other TFT transistors in the case of a so-called active reading.

In the imaging devices 100 described previously, the value of the second limit angle of refraction is obtained by considering an optical index of skin equal to 1.37. When one of the light sources 104 is switched on, knowing the photo-detectors 106 intended to receive the rays forming the outer edge of the region 114, it is possible to conduct an estimation of the optical index of the two media present on the capture surface 109, this estimation next being used to check that these optical indices indeed correspond to that of air (optical index equal to 1) and skin (optical index of value comprised in a predetermined range). This makes it possible to detect whether the skin lit up by this light source corresponds to genuine skin, or if this skin is artificial. The imaging device 100 is thus well suited to conducting a detection of fraud when this device 100 is used as fingerprint sensor. It is also possible to estimate the optical index of the imaged element from the dimensions of the region 114.

In all the embodiments, the optical medium 108 may correspond to several superimposed layers of transparent material. For example, if the smartphone in which the imaging device 100 is produced initially comprises a glass of thickness less than that desired to have correct operation of the imaging device 100, it is possible to add an additional protective glass making it possible to form, with the initial glass, an optical medium 108 having the desired thickness. In this case, the materials used to form the optical medium 108, the additional protective glass and the glue between these two elements are chosen so that their optical indices are as close as possible to each other in order to limit as much as possible reflections at the interfaces of these different elements.

In all the embodiments, it is possible that the sensor 100 comprises a filtering system making it possible to limit or to avoid perturbations which could be due to the lighting of the sensor 100 by light external thereto. This filtering system may correspond for example to a pair of polarising filters, or instead wavelength filters or instead angular filters only allowing light rays having a certain value of incidence angle to pass.

Moreover, in all the embodiments, the sensor 100 may be used to conduct a static print capture, that is to say with a finger not moving on the optical medium 108, or instead to form a scanning sensor, that is to say suited to capturing the print of a finger in movement on the optical medium 108. In the case of a scanning sensor, a lower number of light sources 104 may be used compared to a static print sensor because the image does not need to have a large dimension in the direction of displacement of the finger. Moreover, during the computation of the final image produced from captured partial images, the displacement of the element to image carried out between the capture of each of the partial images will be calculated and taken into account. To construct the final image, a capture of partial images is sufficient because the finger moves between two acquisitions of partial images.

Moreover, even if the imaging device 100 may be used advantageously to form a fingerprint sensor, it is also possible to use the imaging device 100 as device for detecting movement of the element to image to form for example a pointing device, or touchpad.

Generally speaking, the photo-detectors 106 of the imaging device 100 used during captures of images receive a considerable quantity of light coming from the light sources 104. Thus, the integration times of the imaging device 100 are short. For example, when the imaging device 100 forms a sensor having a resolution of pixels of 500 ppi, the acquisition of the complete image (obtained by switching on 32 light sources) is produced in a little less than 50 ms.

In all the embodiments, given that a same point of skin may be read by several different photo-detector 106/light source 104 pairs, a failure of one of these pairs may be compensated by using another of these pairs. Thus, potential manufacturing defects of certain pixels may be compensated, which limits the impact of errors obtained on reading the print. Moreover, the device 100 remains functional even if certain pixels no longer work. For example, if a faulty pixel corresponds to one of those of which the LED is not intended to be lit to capture a part of the print, then the information not captured by this pixel may be obtained from another image partially covering that including the faulty pixel. If the faulty pixel corresponds to one of those of which the LED is intended to be switched on to capture a part of the print, it is possible to use a neighbouring pixel of which the LED could be read and conduct a capture of a part of the print.

In the case of an imaging device 100 of considerable size, for example produced with light sources 104 of OLED type, it may be envisaged, during image capture, to switch on several light sources 104 simultaneously provided that these light sources 104 are sufficiently far apart from each other in order that the light rays coming from one of the light sources 104 and arriving in a region 114 provided to be lit up by rays coming from another light source 104 have a negligible intensity. Advantageously, these light sources 104 sufficiently far apart and lit simultaneously are arranged on a same line, which makes it possible to reduce the overall duration of capture of the element to image when the imaging device 100 is configured to read all the pixels of a same line simultaneously.

In the different embodiments and exemplary embodiments described previously, when the arrays of light sources 104 and photo-detectors 106 are interlaced, each pixel may comprise one of the light sources 104 and one of the photo-detectors 106.

In an alternative, it is possible that each pixel comprises either a light source 104, or a photo-detector 106. Indeed, given that each pixel of the final image may be seen by several photo-detector/light source pairs, redundancy exists in the captured information and it is thus not necessary to have a photo-detector/light source pair within each of the pixels of the device 100. Thus, it is possible to have periodically, within the array, pixels not comprising photo-diodes in order to free up space for the production of the light sources.

In all the embodiments described previously, the capture produced by the imaging device 100 enables a final monochromatic image to be obtained, the light sources 104 being able to be produced such that they emit a light according to a same wavelength (for example of red or green colour). However, given that the light acquisition is based on the phenomenon of frustrated total reflection, the formation of the image does not depend or depends little on the wavelength of the light. It is however possible to take it into account during the reconstruction of the final image in order to limit the impact of chromatic aberrations.

It is however possible to produce the imaging device 100 such that the acquired image is in colours via the use of light sources 104 emitting lights of different colours. For example, it is possible to have, from one line to the other of the array of light sources 104, light sources 104 emitting a light of different wavelengths. Thus, a first line of light sources 104 may emit a green light, a second line of light sources 104 may emit a red light, a third line of light sources 104 may emit a blue light, and so on for all the lines of the array of light sources 104.

Moreover, the light sources 104 may be shared between several photo-detectors 106 arranged side by side, by producing for example each of the light sources 104 at the centre of a group of four pixels each comprising a photo-detector 106.

According to another alternative, it is also possible, notably when the imaging device is produced using CMOS technology, to produce each pixel such that it comprises a photo-detector 106 and three light sources 104 each configured for emitting a light of red, green or blue colour. Thus, the sensor part of the imaging device 100 forms a colour display which can merge for example with the remainder of the screen of the smartphone in which the imaging device 100 is integrated.

It is also possible to have an imaging device 100 serving for example as "flash", that is to say configured for emitting a white light of high intensity. Such an imaging device 100 may in this case be arranged on the rear side of the electronic device of smartphone type, this flash serving for example when a photograph is taken.

In the different embodiments described previously, the capture 109 and detection 111 surfaces formed by the upper and lower faces of the optical medium 108 are substantially flat. It is however possible to envisage having at least one of these surfaces, notably the capture surface 109, which is concave or convex. It is advisable in this case to take into account the radius of curvature of this face which influences the reflection of the light rays on this face, and thus the choice of the photo-detectors 106 to use for the acquisition of each of the partial images of the element to image, as well as the associated magnification or distortion factors. Since these parameters are stable, a calibration of the system may advantageously be implemented in production.

In the different embodiments described, it is possible to control the light emission angle of the LEDs, for example via the deposition of a layer of low optical index in front of the finger, such that the limit angle between this layer and the glass corresponds to the desired angle value. Such a control may for example serve to switch on simultaneously two light sources which would not be sufficiently far apart from each other so as not to interfere with each other.

The invention claimed is:

1. An optical imaging device comprising at least:
an array of light sources each being substantially a point light source, produced on a substrate and forming a display screen,
an array of photo-detectors produced on the substrate and interlaced with the array of light sources,
an optical medium of thickness greater than a pitch of photo-detectors in the array of photo-detectors, covering the light sources and the photo-detectors, through which light intended to be emitted by the light sources is capable of propagating, and forming a capture surface against which an element to image is intended to be arranged and a detection surface substantially parallel to the capture surface and against which the arrays of light sources and photo-detectors are arranged,
a controller and a reader, configured for successively switching on and off each of a part of the light sources and, during the switching on of each of said part of the light sources, reading at least one part of the photo-detectors intended to receive light rays coming from a switched-on light source of the light sources and having undergone reflection against the capture surface while forming, with the capture surface, an angle of incidence estimated as a function of the optical medium and the element to image.

2. The optical imaging device according to claim 1, in which a value of an angle of incidence is comprised between, or equal to, that of a first limit angle of refraction defined by the optical index of the optical medium and the optical index of the atmosphere in which the element to image is located, and that of a second limit angle of refraction defined by the optical index of the optical medium and an additional optical index of value greater than that of the optical index of the optical medium and less than or equal to that of the optical index of the element to image.

3. The optical imaging device according to claim 2 in which the controller and the reader are configured to read, during the switching on of each of said part of the light sources, photo-detectors located in a region of the detection surface of annular shape delimited by the reflected light rays forming, against the capture surface, the first and second limit refraction angles.

4. The optical imaging device according to claim 1, in which the controller and the reader are configured such that the photo-detectors read during the switching on of each of the part of the light sources deliver a partial image of the element to image such that each of the partial images obtained partially overlaps with at least one other of the partial images of the element to image.

5. The optical imaging device according to claim 4, further comprising a calculator for computing a final image of the element to image from the partial images of the element to image.

6. The optical imaging device according to claim 1, further comprising additional light sources arranged outside of the array of light sources and aligned with bisecting lines of angles formed by corners of the array of light sources.

7. The optical imaging device according to claim 1, in which each pixel of the display screen comprises one of the light sources and one of the photo-detectors.

8. The optical imaging device according to claim 1, in which the light sources comprise LEDs, and the controller and the reader comprise CMOS transistors, or in which the light sources are of OLED type, and the controller and the reader comprise TFT transistors arranged in an interlaced manner with the array of photo-detectors.

9. The optical imaging device according to claim 8, in which, when the light sources are of OLED type and when the controller and the reader comprise TFT transistors, said TFT transistors are produced on the substrate which is transparent and which forms the optical medium.

10. The optical imaging device according to claim 1, in which the thickness of the optical medium is greater than around 50 µm, or in which the optical medium comprises a glass plate of thickness greater than or equal to around 700 µm.

11. A method for capturing images implemented with an optical imaging device according to claim 1,
the method for capturing images comprising implementation of the following steps:
a) switching on one of the light sources,
b) reading at least one part of the photo-detectors receiving light rays coming from a switched-on light source and having undergone reflection against the capture surface while forming, with the capture surface, an angle of incidence estimated as a function of the optical medium and the element to image, and
c) switching off the switched-on light source,
steps a) to c) being repeated for each part of the light sources.

12. The method according to claim 11, in which a value of the angle of incidence is comprised between, or equal to, that of a first limit angle of refraction defined by the optical index of the optical medium and the optical index of the atmosphere in which the element to image is located, and that of a second limit angle of refraction defined by the optical index of the optical medium and an additional optical index of value greater than that of the optical index of the optical medium and less than or equal to that of the optical index of the element to image.

13. The method according to claim 12, in which steps a) to c) are also implemented for additional light sources arranged outside of the array of light sources and aligned with bisecting lines of the angles formed by corners of the array of light sources.

14. The method according to claim 11, in which the photo-detectors read during step b) are those located in a region of the detection surface of annular shape delimited by the reflected light rays forming, against the capture surface, the first and second limit refraction angles.

15. The method according to claim 11, in which the photo-detectors read during each implementation of step b) deliver a partial image of the element to image such that each of the partial images obtained partially overlap with at least one other of the partial images of the element to image.

16. The method according to claim 15, further comprising implementation of a step of computing a final image of the element to image from the partial images of the element to image.

17. The method according to claim 11, wherein:
the light sources comprise LEDs and the controller and the reader comprise CMOS transistors, or
the light sources are of OLED type, and the controller and the reader comprise TFT transistors arranged in an interlaced manner with the array of photo-detectors.

18. The method according to claim 17, wherein, when the light sources are of OLED type and when the controller and the reader comprise TFT transistors, said TFT transistors are produced on the substrate which is transparent and which forms the optical medium.

* * * * *